(12) United States Patent
Miller et al.

(10) Patent No.: US 8,518,220 B2
(45) Date of Patent: *Aug. 27, 2013

(54) METHOD FOR PREDICTING AND COMPENSATING EROSION IN A MAGNETRON SPUTTERING TARGET

(75) Inventors: Keith A. Miller, Sunnyvale, CA (US); Daniel C. Lubben, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/367,640

(22) Filed: Feb. 7, 2012

(65) Prior Publication Data

US 2012/0132518 A1    May 31, 2012

Related U.S. Application Data

(63) Continuation of application No. 11/961,921, filed on Dec. 20, 2007, now Pat. No. 8,133,360.

(51) Int. Cl.
| | |
|---|---|
| *C23C 14/00* | (2006.01) |
| *C23C 14/32* | (2006.01) |
| *C25B 9/00* | (2006.01) |
| *C25B 11/00* | (2006.01) |
| *C25B 13/00* | (2006.01) |

(52) U.S. Cl.
USPC ............... 204/192.13; 204/192.12; 204/298.2

(58) Field of Classification Search
USPC .............................. 204/192.12, 192.13, 298.2
See application file for complete search history.

(56) References Cited

U.S. PATENT DOCUMENTS

| | | | |
|---|---|---|---|
| 5,252,194 A | 10/1993 | Demaray et al. | |
| 6,852,202 B2 | 2/2005 | Miller et al. | |
| 7,018,515 B2 | 3/2006 | Gung et al. | |
| 2003/0217913 A1 | 11/2003 | Hong et al. | |
| 2005/0133361 A1 | 6/2005 | Ding et al. | |
| 2005/0133365 A1 | 6/2005 | Hong et al. | |

FOREIGN PATENT DOCUMENTS

JP         07-224377 A        8/1995

*Primary Examiner* — Michael Band
(74) *Attorney, Agent, or Firm* — Charles S. Guenzer

(57) ABSTRACT

When a magnetron is scanned about the back of a target in a selected complex path having radial components, the erosion profile has a form depending upon the selection of paths. A radial erosion rate profile for a given magnetron is measured. Periodically during scanning, an erosion profile is calculated from the measured erosion rate profile, the time the magnetron spends at different radii, and the target power. The calculated erosion profile may be used to indicate when erosion has become excessive at any location prompting target replacement or to adjust the height of the magnetron above the target for repeated scans. In another aspect of the invention, the magnetron height is dynamically adjusted during a scan to compensate for erosion. The compensation may be based on the calculated erosion profile or on feedback control of the present value of the target voltage for a constant-power target supply.

15 Claims, 7 Drawing Sheets

METHOD FOR PREDICTING AND COMPENSATING EROSION IN A MAGNETRON SPUTTERING TARGET

RELATED APPLICATION

This application is a continuation of Ser. No. 11/961,921, filed Dec. 20, 2007, now issued as U.S. Pat. No. 8,133,360.

FIELD OF THE INVENTION

The invention relates generally to sputtering of materials. In particular, the invention relates the vertical movement of a magnetron in back of a sputtering target.

BACKGROUND ART

Sputtering, alternatively called physical vapor deposition (PVD), is the most prevalent method of depositing layers of metals and related materials in the fabrication of integrated circuits. Sputtering was developed to deposit planar metal layers used for interconnects and commercial sputtering typically utilizes a plasma of a sputter working gas, usually argon, to bombard the negatively biased target with argon ions to sputter atoms of the target material, which thereafter coat the wafer with a layer of the target material. In reactive sputtering of metal nitrides, nitrogen gas is additionally admitted into the sputtering chamber.

More recently, sputtering has been adapted to deposit thin layers of metal and metal nitride onto the walls of high-aspect ratio holes such as vias and trenches. Sputtering is widely used to deposit barrier layers of a refractory metal such as tantalum and the refractory nitride on via walls to prevent the diffusion of copper from the via into the surrounding dielectric layer of silicon oxide or low-k dielectric material. It is also used to deposit a thin copper seed layer onto the via walls to act as a plating electrode and a nucleating layer for copper filled into the via hole by electrochemical plating (ECP).

In plasma sputtering as typically practiced commercially, a target of the material to be sputter deposited is sealed to a vacuum chamber containing the wafer to be coated. Argon is admitted to the chamber. When a negative DC bias of several hundred volts is applied to target while the chamber walls or shields remain grounded, the argon is excited into a plasma. The positively charged argon ions are attracted to the negatively biased target at high energy and sputter target atoms from it. An exemplary target 10, illustrated in the schematic cross-sectional view of FIG. 1, is arranged around a central axis 12 of the vacuum chamber. The target 10 often includes a backing plate 14, which may be composed of brass, to which is bonded a target layer 16, for example of copper or tantalum. However, unitary copper targets are possible. A magnetron 18 positioned in back of the target 10 includes two opposed magnetic poles 20, 22 magnetically coupled at their back through a magnetic yoke 24 to project a magnetic field B in front of the target layer 16. The magnetic field traps electrons of the plasma and hence increases the density of the plasma to thereby increase the sputtering rate. The magnetron 18 is typically offset from the central axis 12 of the target 10 but is rotated about it to increase the azimuthal deposition uniformity. Commercial magnetrons have a more complicated shape than that illustrated in FIG. 1.

The adaptation of sputtering to coating the walls of high aspect-ratio holes has rested in part on decreasing the size of the magnetron so that the target power is concentrated in a smaller area and thus produces a higher target power density, thereby increasing the density of the plasma to a level such that a sizable fraction of the sputtered atoms are ionized. If the wafer is electrically negatively biased, the sputtered ions can be drawn deep within narrow holes in the wafer. It has been found that sputtering into high aspect-ratio holes with a high ionization fraction of sputtered atoms is promoted by primarily scanning the small magnetron 18 near the periphery of the target 10. The sputtered ions nonetheless diffuse towards the center.

Although in the past, magnetrons were designed for uniform target erosion, ionized sputtering with a small magnetron may preclude uniform erosion. Further, if only the outer portion of the target is sputtered, some of the sputtered atoms redeposit near the target center and build up an increasing thickness of redeposited material, which does not adhere well to the target and is likely to flake off and produce an unacceptable number of particles which fall on the wafer and introduce defects in the final devices. To counter this problem, Hong et al. disclose in U.S. Pat. No. 7,018,515 a magnetron that pivots between a radially outer position used for most of the sputter deposition and a radially inner position in which the magnetron cleans the target.

Care must be taken to account for erosion of the target. The peripheral scanning of the small magnetron 18 erodes the target layer 16 to produce an annular groove 26 while the central portion of the target layer 16 is eroded less below its original surface 28. Excessive sputtering of the target 10 will punch through the target layer 16 to sputter the exposed underlying backing plate 14 and contaminate the chamber especially if a tantalum barrier layer is being sputter deposited. In the case of a unitary target, excessive sputtering may mechanically weaken the target to the point where it cannot stand off the vacuum. In response to these problems, erosion may be accounted for by measuring the erosion in a test as a function of lifetime target energy, for example, the number of kilowatt-hours (kW-hr) applied to the target during operational sputtering. The lifetime target energy is experimentally established for a combination of target and magnetron as the target energy at the end-point of target sputtering, for example, just before the target layer is sputtered through to expose the backing plate. For a fixed combination of magnetron and target configuration, the measured endpoint target energy dictates when the target should be replaced.

Erosion causes a further problem in plasma sputtering. As the target 10 is eroded, the sputtering surface within the target layer 16 recedes and comes closer to the magnetron 18 so that the magnetic field at the sputtering surface changes over the lifetime of the target 10. The sputtering rate depends on the magnitude of the magnetic field B adjacent the sputtering surface, which increases with the depth of erosion. Also, the plasma may become unstable under changes of magnetic field, possibly extinguishing or sparking, the latter of which can create damaging particulates. Hong et al. in US patent application publication 2005/0133365 disclose the advantage of periodically adjusting the spacing between the target and the magnetron to compensate for long-term erosion of the target over many wafer cycles and to thereby regularize the sputtering plasma.

Miller et al. describe in U.S. Pat. No. 6,852,202 a planetary gear mechanism which achieves somewhat similar results to the two-position magnetron of U.S. Pat. No. 7,018,515 by scanning a small magnetron in a multi-lobed pattern across back of the target. Miller et al. describe a more general epicyclic scan mechanism, referred to as a universal magnetron motion (UMM) mechanism, in U.S. patent application Ser. No. 11/924,573, filed Oct. 25, 2007, now published as U.S. patent application publication 2008/0060938, and incorporated herein by reference for the details of the scanning mechanism. While the scan pattern for the planetary gear mechanism is fixed by the gears and arms forming the mechanism, the UMM mechanism can produce a nearly arbitrary scan pattern by the independent rotations of two coaxial shafts.

SUMMARY OF THE INVENTION

One aspect of the invention calculates a predicted erosion profile for a target being scanned by a magnetron in a complex and selected path. The calculated erosion profile may be used to determine the end of life of the target, for example, when the target layer is nearly eroded through by the sputtering at possibly only one area.

One method of calculating the erosion profile involves experimentally measuring a calibrated erosion rate profile, for example, an erosion depth per energy applied to the target as the magnetron is rotated at a known radius from the target center. The erosion rate measured at one radius can be converted to an erosion rate at another radius by an inverse linear or nearly linear proportionality. During operational scanning with the same type of magnetron used in the calibration, the erosion rate profile is determined by summing over many scans the product of the erosion rate at known radii of the magnetron, the time spent at those radii, and the power being applied to the target. Computationally, calculation bins at different radii on the target are updated during scanning.

Another aspect of the invention includes moving a magnetron in a path having radial components and dynamically adjusting a spacing between the magnetron and the target during the radial scanning to compensate for a radial erosion profile. The vertical adjustment may be made according to erosion profiles which are periodically calculated. Alternatively, the vertical adjustment may be made by monitoring electrical signals used in powering the target. For example, when the target power supply provides nearly constant power or current to the target, the target voltage may be monitored and used in a feedback loop to control the vertical actuator to return the target voltage to a desired voltage generally corresponding to a desired spacing between the magnetron and the portion of the sputtering surface of the eroded target underlying the magnetron.

DETAILED DESCRIPTION OF THE PREFERRED EMBODIMENTS

Figure 1:
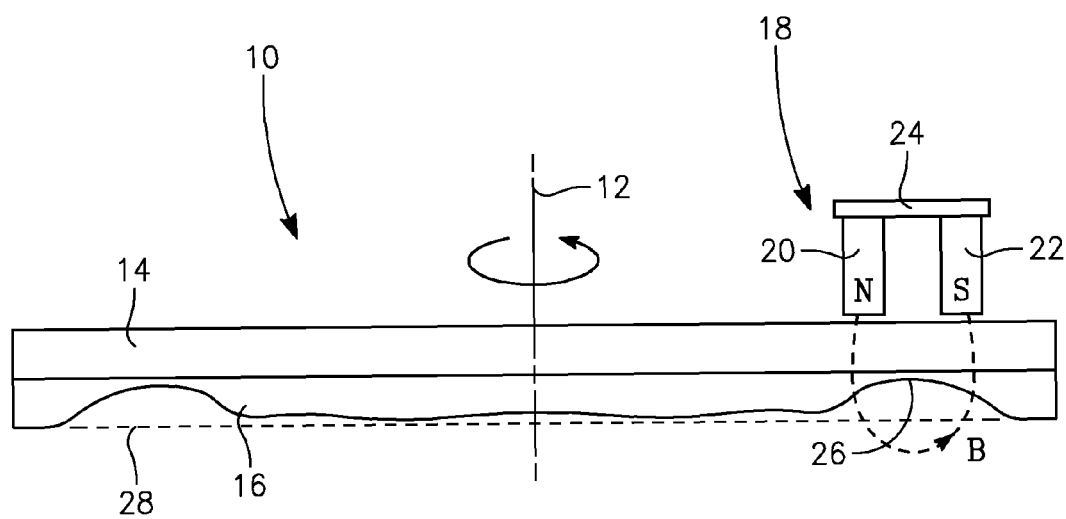
FIG. 1 is a schematic cross-sectional view of a sputtering target and associated magnetron.

The invention has been applied to a sputtering system described in the aforecited U.S. patent application Ser. No. 11/924,573 to Miller et al., hereafter Miller. A sputter chamber 30 schematically illustrated in the cross-sectional view of FIG. 2 includes a conventional main chamber 32 generally symmetric around a central axis 34 and supporting a target 38 through an adapter 40 and an isolator 42. The target 38 may be formed from the material to be sputtered or may include a target layer facing the interior of the chamber body 32 and bonded to a backing plate extending laterally over the isolator 42. The sputter chamber 30 also includes a universal magnetron motion (UMM) actuator 46 located in the back of the target 38 and including an inner rotary shaft 48 and a tubular outer rotary shaft 50, which are coaxial and are arranged about and extend along the central axis 34 and can rotate about it. A first motor 52 is coupled to the inner rotary shaft 48 by a drive gear 34 or other mechanical means such as a belt wrapped around two pulleys to rotate it. A second motor 56 is similarly coupled to the outer rotary shaft 50 through another drive gear 58 or mechanical means to rotate it independently of the rotation of the inner rotary shaft 48. The rotary shafts 48, 50 and their motors 52, 56 are supported on a vertically movable slider 60. A third motor 62 drives a vertical mechanism 64 such as a worm screw mechanism vertically moving the slider 60 and its supported rotary shafts 28, 30.

The rotary shafts 48, 50 are coupled to an epicyclic mechanism 70, which supports a magnetron 72 through a mount 74 and scans it over the back of the target 38 in a nearly arbitrary pattern determined by the rotations of the rotary shafts 48, 50. The epicylic mechanism 70 and its supported magnetron 74 also move vertically with the slider plate 60. The principal embodiment of the Miller epicyclic mechanism 70 is a planetary gear system which differs from the planetary gear mechanism of U.S. Pat. No. 6,852,202 by a sun gear which is rotated by the inner rotary shaft 48 rather than being fixed, as is described in more detail by Miller and will be described in lesser detail below. The magnetron 72 typically includes a magnetic yoke 76 supporting and magnetically coupling an inner pole 78 of one magnetic polarity along the central axis 34 and an outer pole 80 of the opposed magnetic polarity and surrounding the inner pole 78. The magnetron 72 is typically small and circular. The magnetron 72 and large portions of the epicyclic mechanism 70 are disposed in an unillustrated cooling reservoir of recirculating chilled sealed to the back of the target or its backing plate in order to maintain the target 38 at a reasonably low temperature.

Returning to the main chamber 32, a vacuum pump 90 pumps the interior of the main chamber 32 through a pumping port 92. A gas source 94 supplies a sputter working gas, such as argon, into the chamber 32 through a mass flow controller 96. If reactive sputtering is desired, for example, of a metal nitride, a reactive gas, such as nitrogen in the example, is also supplied.

A wafer 100 or other substrate is supported on a pedestal 102 configured as an electrode in opposition to the target 38. A clamp ring 104 may be used to hold the wafer 100 to the pedestal 102 or to protect the pedestal periphery. However, many modern reactors use electrostatic chucks to hold the wafer 100 against the pedestal 102. An electrically grounded shield 106 supported on the adapter 40 protects the chamber walls and sides of the pedestal 102 from sputter deposition and also acts as an anode in the plasma discharge. The working gas enters the main processing area through a gap 108 between the clamp ring 104 or pedestal 102 and the shield 106. Other shield configurations may include an electrically floating secondary shield inside the primary shield 106 and perforations through portions of the primary shield 106 protected by the secondary shield to promote gas flow into the processing area.

A DC power supply 110 negatively biases the target 38 with respect to the grounded shield 106 and causes the argon working gas to be excited and discharge into a plasma. The magnetron 72 concentrates the plasma and creates a high density plasma (HDP) region 112 underneath the magnetron 72 inside the main chamber 32. The positively charged argon ions are attracted to the target 38 with sufficient energy to sputter the metal from the target layer of the target 38. The sputtered metal deposits on and coats the surface of the wafer 100. Preferably for sputter depositing into deep and narrow holes, an RF power supply 114 is connected to the pedestal electrode 102 through a capacitive coupling circuit 116, which acts as a high-pass filter, to create a negative DC self bias on the wafer 110 with respect to the plasma. The self bias is effective at accelerating positive metal ions or possibly argon ions toward the wafer 100 in perpendicular trajectories that more easily enter high-aspect holes. The self bias also imparts a high energy to the ions, which may be controlled to differentiate sputter deposition on the wafer 100 and sputter etching of the wafer 100.

A computer-based controller 118 controls the vacuum pump 90, the argon mass flow controller 96, the power supplies 110, 114 and the magnetron actuator motors 52, 56, 62 according to the desired sputtering conditions and scan patterns input to the system 118 through a recordable medium such as a CDROM inserted into it or equivalent communication lines. A memory 120 associated with the controller 118 is used in the execution of the control algorithms to be described later. For purposes to be described later, a wattmeter 122 and a voltmeter 124 are disposed between the DC power supply 110 and the target 38 to allow the controller 118 to monitor the power and voltage being applied to the target 38. Typically, the DC power supply 110 operates in a constant-power mode so that the power level may be preset be and relatively constant and may be available to the controller 118 as a digital control signal. However, a constant-current supply may also be used. Chang et al. describe a more complex and quicker control circuit for the rotary shaft motors 52, 56 in U.S. patent application Ser. No. 11/948,118, filed Nov. 30, 2007 and now published as U.S. patent application publication 2009/0139854.

Figure 3:
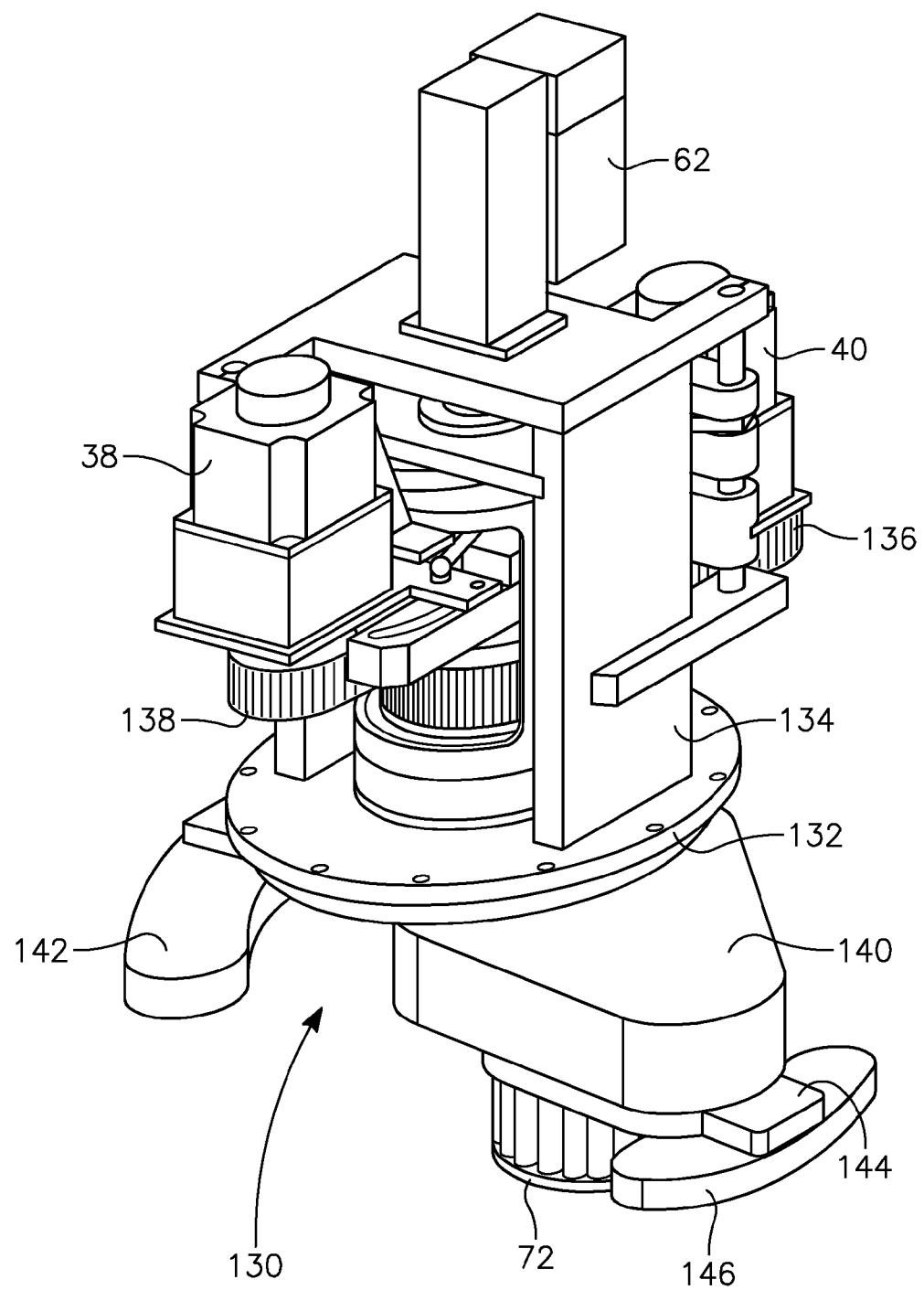
FIG. 3 is an orthographic view of one embodiment of a magnetron and its scanning mechanism.

A more realistic version of the epicyclic scan actuator 46 and attached magnetron 72 is incorporated into a magnetron actuator illustrated in the orthographic view of FIG. 3 in what is referred to as a universal magnetron motion (UMM) mechanism 130. The UMM mechanism 130 is supported on a flange 132, which is supported on and sealed to a top wall of the cooling reservoir. A derrick 134 supported on the flange 132 outside of the reservoir supports the motor 62 of the vertical actuator, which can vertically move the slider 60 which rotatably supports the rotary shafts 48, 50 and the shaft motors 52, 56 coupled to them through ribbed belts 136, 138.

Figure 4:
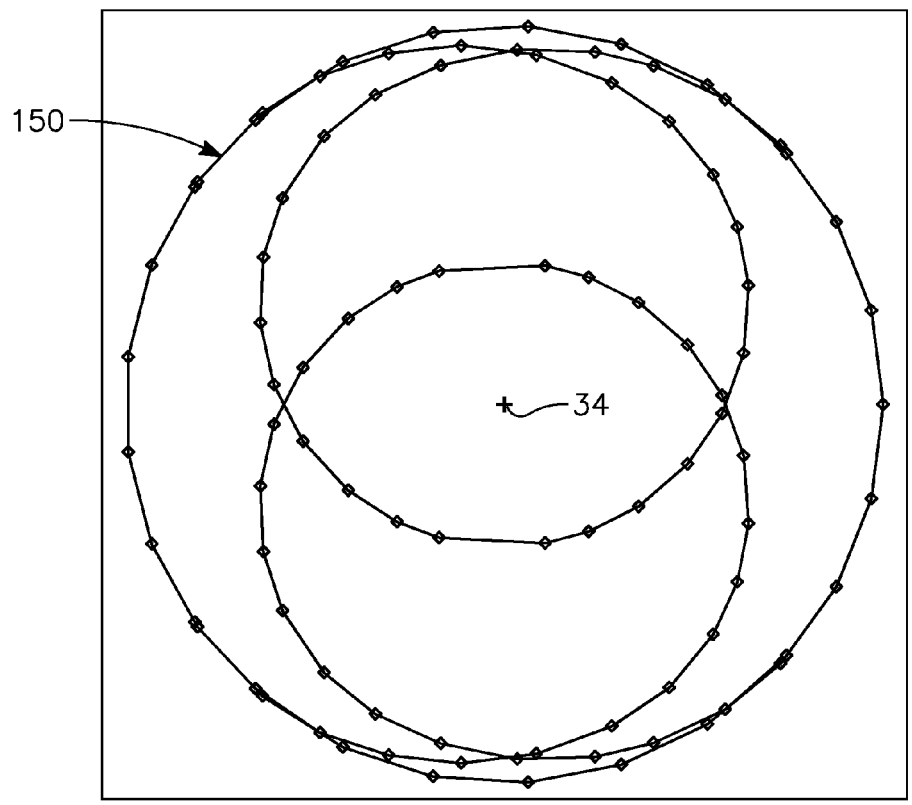
FIG. 4 is an illustration of a complex magnetron scan pattern with which the invention may be used.

The outer rotary shaft 50 passes through a rotary and axial seal into the cooling reservoir and is fixedly attached at its lower end to a gearbox 140 and its counterweight 142. The interior of the gearbox 140 is sealed against the cooling fluid and is at ambient atmosphere. A sun gear is fixed to the lower end of the inner rotary shaft 48 inside of the gearbox 140. A planetary gear system supported inside the gearbox 140 includes the sun gear and a follower gear rotatably coupled through an idler gear. The shaft of the follower passes through a rotary seal to support a magnet arm 144. The magnetron 72 is supported at one end of the magnet arm 144 and a counterweight 146 is supported at the other end. Further details of the UMM mechanism are described by Miller. If the inner rotary shaft 48 is rotated so that the sun gear is stationary, rotation of the outer rotary shaft 50 causes the gear box 146 to rotate about the central axis 34 of the chamber and the magnetron 72 executes normal planetary motion of a multi-lobed path about the central axis 34 determined by the length of the arms and the gear ratio. If the two rotary shafts 48, 50 are rotated in synchronism, the magnetron 72 follows a circular path about the central axis 34 at a radius determined by the phase between the two rotations. However, the two rotary shafts 48, 50 can be rotated independently so that the magnetron 72 can be scanned in a nearly arbitrary path independent of arm lengths and gear ratio as determined by instructions from the controller 118. For example, a complex scan pattern 60 illustrated in the plot of FIG. 4 includes a generally circular portion symmetric about the center 34 of the target and two smaller generally circular portions with two different centers offset from the target center 34.

The vertical actuator allows the magnetron to be raised to compensate for target erosion. For example, the magnetron 72 may be kept a constant distance from the surface of the gradually eroding groove in the target layer to thereby maintain constant plasma conditions over the life of the target. Several aspects of the invention involve the control of the vertical movement of the magnetron 72.

The generalized scan pattern achievable with the epicyclic scan mechanism allows the same scan mechanism to be used for different processes resulting in different erosion profiles. Even the same target can be used for different processes. Accordingly, the simple endpoint target energy determined in the past does not dependably predict target failure. Similarly, vertical adjustment of the target-magnetron spacing cannot be easily forecast. At the same time, the smaller sizes of the magnetron have produced steeper erosion profiles.

Figure 5:
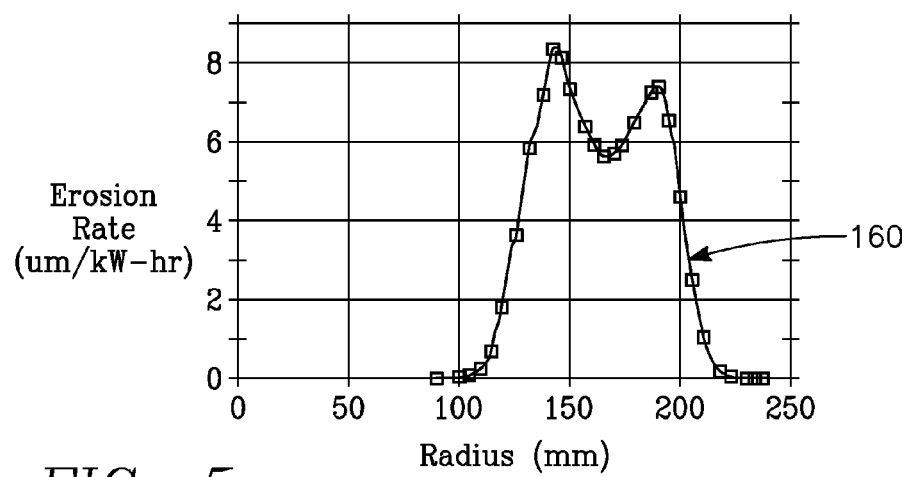
FIG. 5 is a graph of an erosion rate profile for a circularly symmetric scan.

One aspect of the invention allows the erosion profile to be calculated for an arbitrary scan pattern. An erosion rate profile is established for a target type and magnetron as well as the chamber and any process kits incorporated into the chamber, such as shields. The profile can be established by rotating the magnetron at a fixed radius $R_O$ from the target center. The radius $R_0$ is conventionally referenced to the center of a circular magnetron. During the calibration phase, vertical compensation should be performed since it will be performed during operation. The calibration sputtering should result in a circularly symmetric pattern. After extended sputtering, the depth of erosion is measured across a target radius and normalized to the energy applied to the target during the calibration test to establish an erosion rate profile $e(r, R_O)$ as a function of the radius r from the target center. The energy is the integral of the target power and time during the calibration sputtering, for example, in units of kW-hr. An erosion rate profile 160 is plotted in the graph of FIG. 5 in units of μm/kW-hr for a target location $R_0=165$ mm. The width in the radial of the profile is caused by the physical size of the magnetron. The two peaks correspond generally to portions of the circular plasma track being aligned with rotational arcs and the central valley corresponds to the portions of the plasma track which are aligned along radii and hence rapidly sweep over the underlying portions of the target.

Although it is possible to perform different calibration tests for different magnetron radii, a single calibration test may suffice. From the single calibration measurement, erosion rate profiles for other magnetron radii $R_i$ may be calculated according to the equation $$e(r, R_i) = \left(\frac{R_0}{R_i}\right)^N e(r, R_0). \tag{1}$$

This equation reflects the geometric relationship between the size of the magnetron and the length of the circle over which it is scanning at some radius from the center. Although a value N=1 is expected from a simple consideration of the geometry, a non-linear relationship is often observed and a value of N between 0.9 and 1.1 is typically used.

The erosion profile E(r) can then be predicted by summing products of the time lengths $T_i$ and target power $P_i$ the magnetron spent at different radii $R_i$ $$E(r) = \sum_i e(r, R_i) T_i P_i. \quad (2)$$

This equation does not reflect the fact that the magnetron will be traversing the same target radius multiple times during its total scan perhaps at different power levels. The azimuthal positions do not appear in Eqn. (2). It is assumed that over relatively long time periods the target is being eroded with circular symmetry despite the non-circular components of a complex path such as that of FIG. 4. The circularized erosion path for long production runs is obtain by forcing the repeated scans to begin at random times so that the desired scan path is being rotated azimuthally between multiple wafer cycles.

Figure 6:
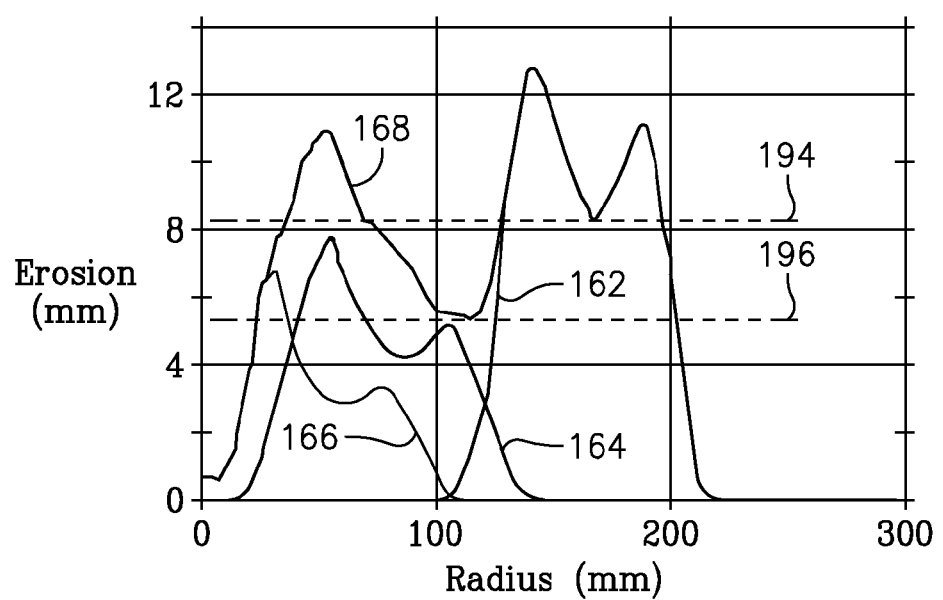
FIG. 6 is a graph of erosion rate profiles derived from that of FIG. 5 and normalized to other radii of rotation

In an example of an erosion rate, as illustrated in the graph of FIG. 6, trace 162 plots the erosion profile when the magnetron is scanned at a radius $R_0$=160 mm for a first time period with a first target power, trace 164 plots the erosion profile when the magnetron is scanned at a radius $R_0$=80 mm for a second time period with a second target power, and trace 166 plots the erosion profile when the magnetron is scanned at a radius $R_0$=60 mm for a third time period with a third target power. Trace 168 is a sum of the other three traces 162, 164, 166 and plots the total erosion profile for all three scans.

In practice, however, for large portions of a complex scan, the radius of the magnetron is fairly rapidly changing. Further, rather than performing a running calculation of this nature when only infrequent action is required, an easier approach is to keep track of accumulated energy at each radii. That is, counters can established in the memory 120 accessed by the controller 118. The data can be arranged in bins, for example, bins arranged every 10 mm from 0 to 295 mm but a smaller number may be used for typical scanning patterns, for example, bins arranged at radii from 90 to 235 mm.

The erosion rate data need to be tabulated for these same bins and have the same granularity. At fixed and relatively short intervals, for example, every 100 ms, the current target power is added to the previous value in the bin corresponding to the current radius of the magnetron. The time period is constant and needs to be considered only in the calculation.

Figure 7:
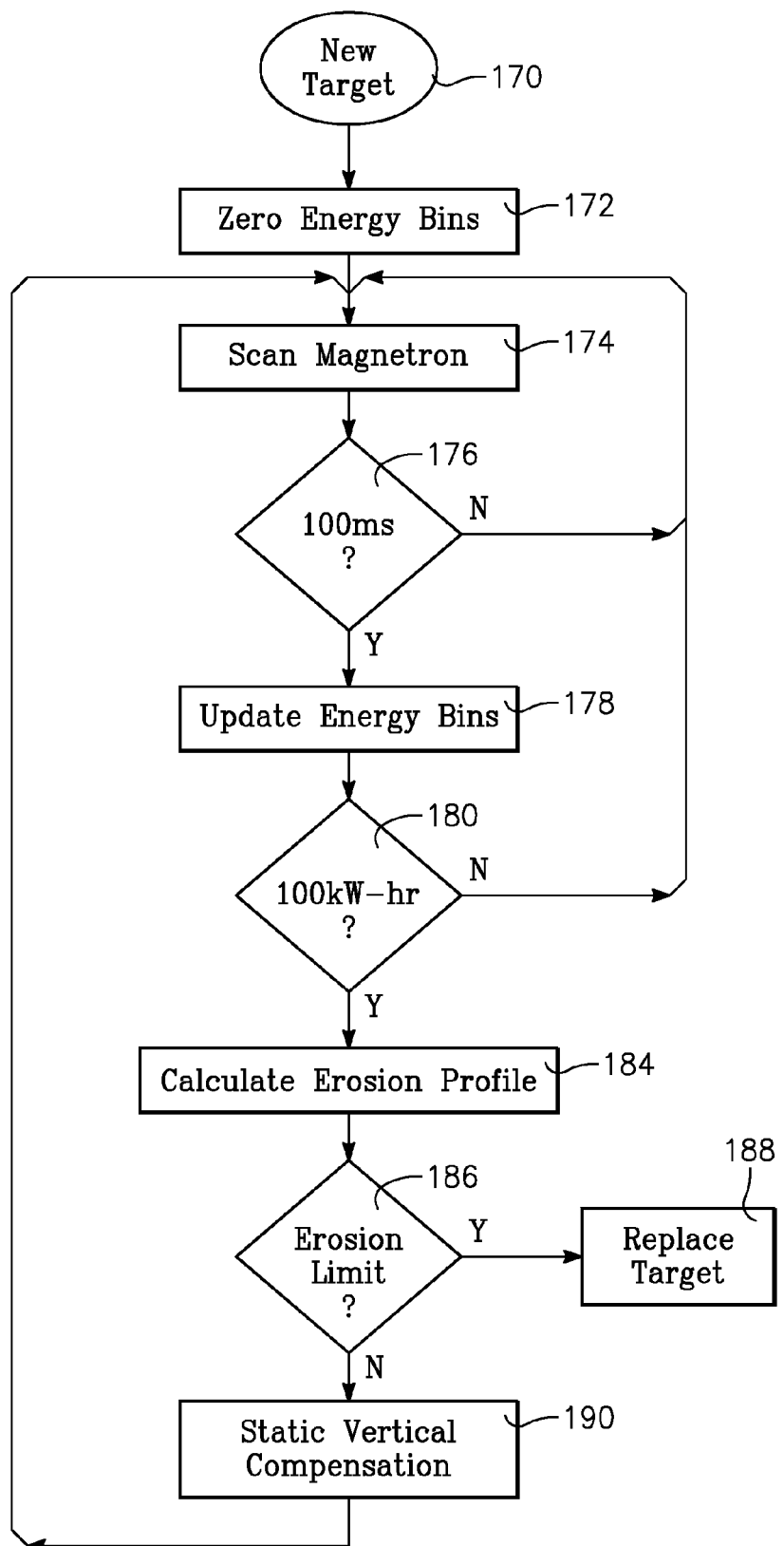
FIG. 7 is a flow diagram of one embodiment of a method of practicing the invention including static vertical compensation of target erosion.

An exemplary control method for such an operation is illustrated in the flow diagram of FIG. 7. It is understood that a typical commercial control system relies on polling and interrupts so the illustrated flow diagram is used only for an understanding of the operation. An initial state 170 indicates that a new fresh target has been installed in the sputter chamber having no erosion. It is assumed that the target is one of a class for which the erosion rate has been measured for at least one radius and the erosion rate profiles are available for all radial positions of the magnetron corresponding to the energy bins. In an initialization step 172, the energy bins are all initialized to zero.

In a scan step 174, the magnetron is scanned according to the current recipe. In an updating test 176, it is determined if a short set time, for example, 100 ms, has elapsed since the last update of the energy bins. If not, the scanning simply continues. If the short set time has elapsed, in update step 178, the energy bins are updated. The updating consults the current recipe and the time since the beginning of the current cycle to determine both the current radial position $R_i$ of the magnetron and the target power. The target power can be derived either from the wattmeter 122 or more simply from the process recipe. In a simple version of the algorithm, the update step 178 only updates the energy in the bin for the current target radius $R_i$ and the calculation of the erosion profile is left to a later step. In a variant method particularly applicable in production runs, each wafer cycle includes the same scan at the same power for the same total scan length. Accordingly, at the end of a wafer cycle, the energy update step 178 may update the energy bins for the entire scan period based upon values established for the current recipe.

In a profile test 180, it is determined if a long energy period, for example, 100 kW-hr as measured in total energy delivered to the target, has elapsed since the erosion profile has last been calculated. If not, the scanning continues. If the energy period has been exceeded, a calculation step 182 calculates or predicts the current erosion profile. The erosion amount $E(r_j)$ at radius $r_j$ is the sum of Equation (2).

The profile test 180 may be coordinated with the wafer sputtering cycle, that is, performed when wafers are being transferred in and out of the sputter chamber. The cycling may coincide with a change of sputter recipe including scanning pattern and target power.

In a limit test 184, it is determined if the erosion profile defined by the values of $E(r_i)$ shows that the target erosion has reach a limit and a target needs to be replaced. An exemplary test is that when the maximum erosion amount $E(r_j)$ is within a minimum thickness value of the initial target thickness before erosion, the target should be replaced in a maintenance step 188. Thereafter, the new target condition 170 is attained. The minimum thickness value may be the erosion expected for another 100 kW-hr of operation, but a wide margin of error should be included. If the erosion limit has not been reached, the scanning continues.

Another aspect of the invention uses a calculated erosion profile for static vertical compensation. A static vertical compensation step 190 may be included in the process of FIG. 7. In this step 190, the controller consults the erosion profile calculated in step 184 and from it determines how far to vertically move the magnetron through its vertical actuator motor 62 to compensate for target erosion. Generally, as should be apparent from FIG. 1, the distance between the bottom of the magnetron 18 and the eroded surface of the target layer 16 should be maintained constant. In the case of the well defined groove 26 of FIG. 1, the vertical compensation may be easily determined as the maximum target erosion. However, the choice is not so obvious for a complex erosion profile, such as the total profile 168 in FIG. 6. One choice is a compensation level 194 taken as the average of the erosion profile over a significantly scanned portion of the target. Another choice is a compensation level 196 taken as the minimum amount of erosion over the significantly scanned portion of the target. The latter choice is driven the phenomenon that if the magnetron is placed too far away from the current sputtering face of the target, the magnetic field strength may be too low to maintain the plasma and the plasma collapses. Either sputtering effectively ceases or, if the plasma spontaneously reignites over a more eroded portion, the reignition may cause a spark or flash which sputters a large particle, which may cause the integrated circuit on which it falls to fail.

When the scanning step 174 resumes, the magnetron is at its new compensated vertical position and continues there in static compensation for at least one and probably many wafer cycles of horizontal scanning.

Another aspect of the invention dynamically changes the target-magnetron spacing during the scan path to compensate for the calculated erosion profile. In particular, it is possible to move the magnetron vertically while the magnetron is being scanned azimuthally and radially as part of the arbitrary horizontal scan pattern. The vertical movement may in large part follow the erosion profile to compensate for erosion and provide a nearly constant spacing between the magnetron and the sputtering surface underlying the magnetron at all times during the scan. That is, referring to FIG. 1, the controller 118 may be varying the rotation rate of all three actuator motors 52, 56, 62 during the scanning.

Figure 8:
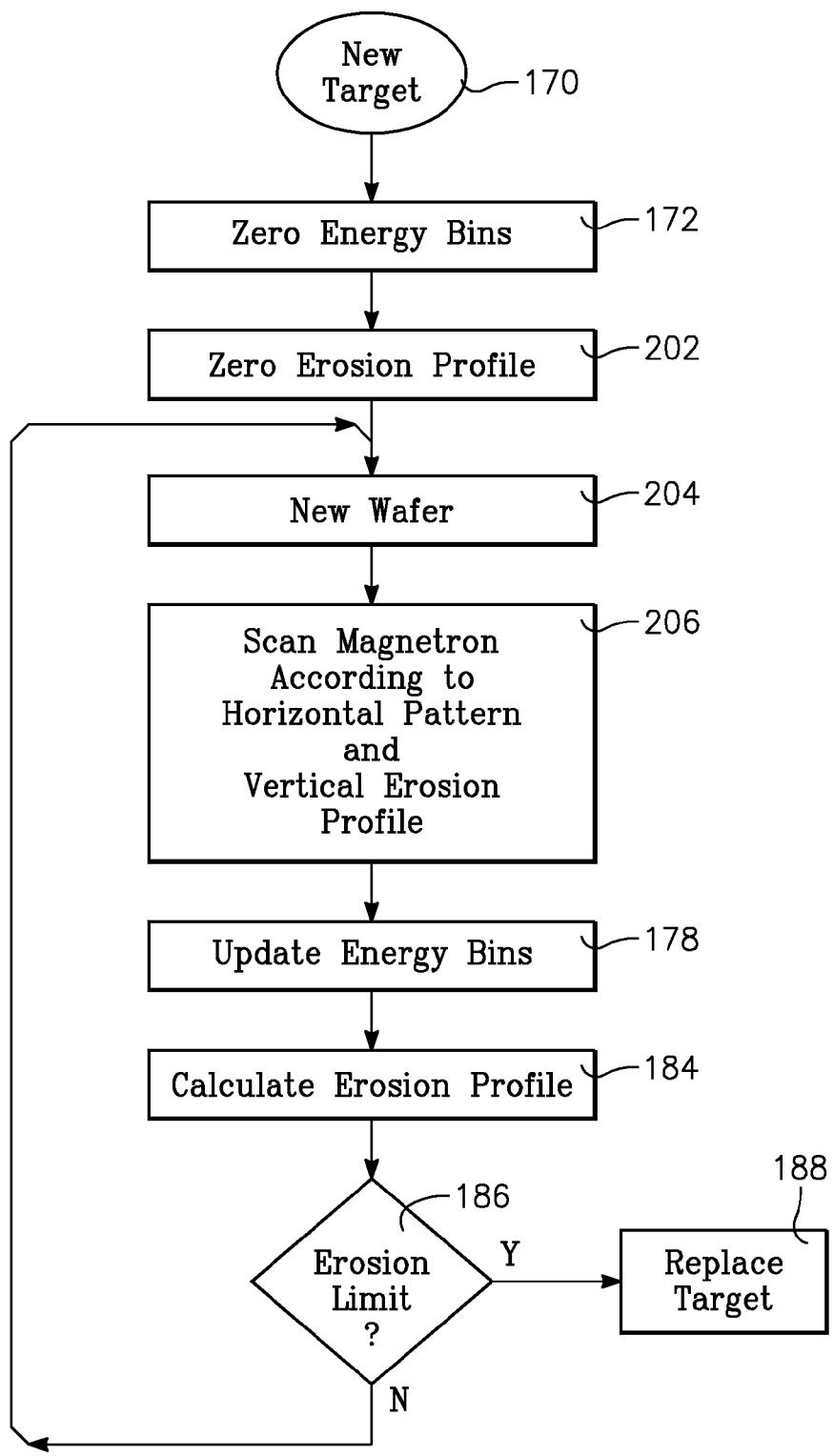
FIG. 8 is a flow diagram of another embodiment of a method of practicing the invention including dynamic vertical compensation of target erosion.

An embodiment of a method of practicing this aspect of the invention is illustrated in the flow diagram of FIG. 8. In an initialization phase after the initial state 170 of a new target, the energy bins are zeroed or otherwise initialized in the energy initialization step 172 and the erosion profile is initialized, for example, zeroed in an erosion initialization step 20. Entering the wafer cycle, in a wafer transfer step 204, a processed wafer, if any is present in the sputter chamber 30, is removed from the sputter chamber and a fresh wafer is transferred into it. This step was implicit in the method of FIG. 7. In a scan step 206, a complete scan of the magnetron for the new wafer is performed. The scan includes both the horizontal scan pattern dictated for the selected process being performed and a vertical movement in accordance with the current calculated erosion profile. The time period and the horizontal scan path of the scan step 206 are determined by the process recipe. In the first wafer cycle it is typical that there is no erosion in the wafer so no vertical motion is required for the magnetron. It is appreciated that the vertical motion during the scan step 206 need not directly follow, the current calculated erosion profile since the features of the profile may be significantly smaller than the dimensions of the magnetron. Instead, some averaging of the erosion profile may be performed to determine a vertical scan profile used in the scan step 206.

After completion of the scan step 206 and probably simultaneous with the wafer transfer step 204, in the update step 178 the energy bins are updated for the entire scan pattern and in calculation step 184 the erosion profile is calculated based on the updated. If the limit test 186 determines that the erosion limit has not been reached, execution returns for a new wafer starting with the wafer transfer step 204. If the erosion limit has been reached, then the target is replaced in the maintenance step 188.

Aside from the dynamic vertical compensation, the process of FIG. 8 also differs from that of FIG. 7 in not including the two tests 176, 180 and in updating the energy bins only at the completion of a scan. The static erosion compensation can be performed with the timing of FIG. 8 and the dynamic erosion compensation can be performed with the timing of FIG. 7.

Figure 2:
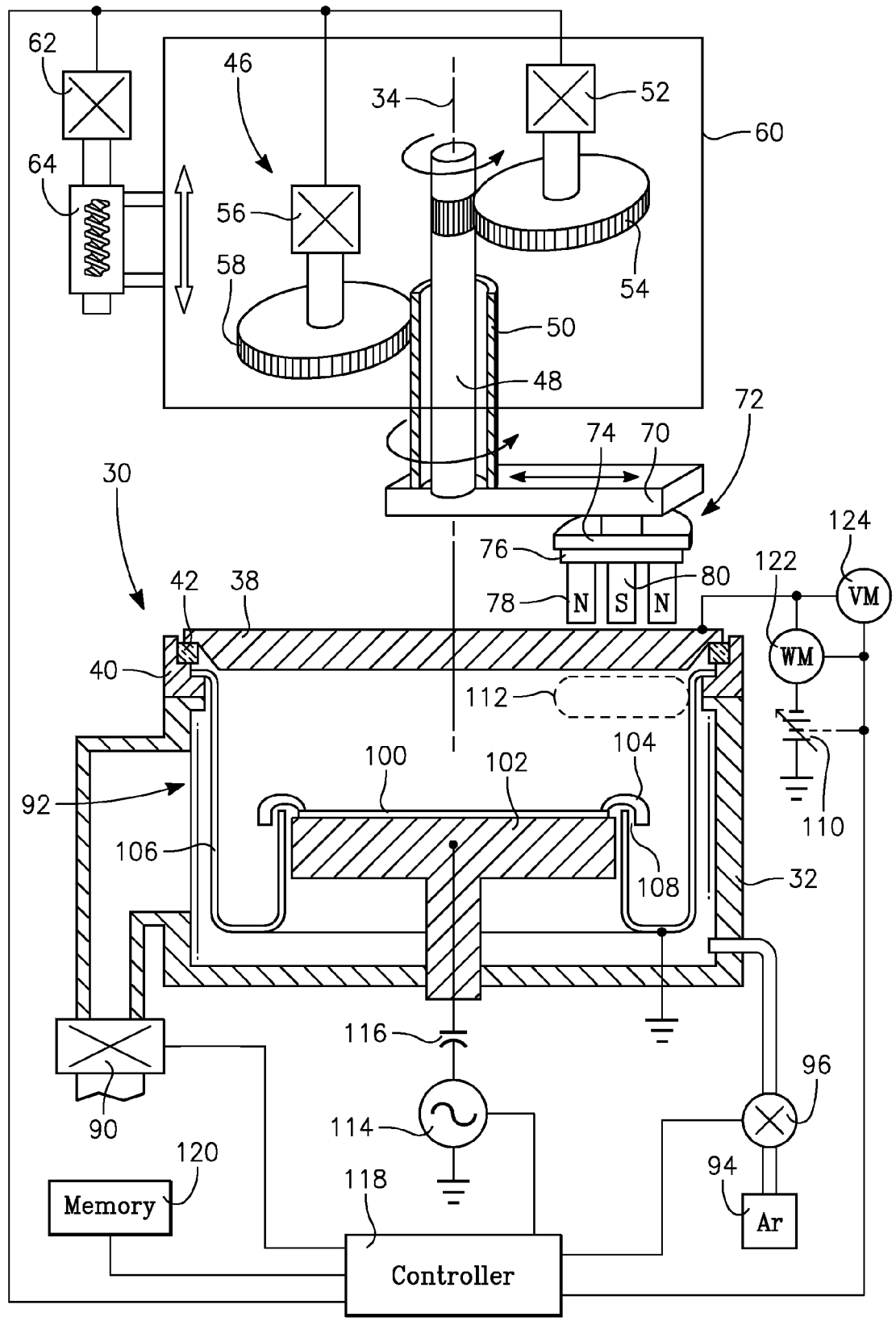
FIG. 2 is schematic cross-sectional view of a sputter chamber including a general epicyclic scan mechanism for its magnetron.

The vertical profile used in the scan step 206 depends upon the calculated erosion profile. Alternatively, closed loop control of the vertical position of the magnetron may be performed. With reference to FIG. 2, it is known that when the target DC power supply 110 is operating in a constant-power mode or constant-current mode or somewhere in between, the target voltage is sensitive to overall erosion of the target. According to another embodiment of the invention, dynamic erosion compensation can be performed by setting up closed-loop control of the vertical magnetron position. The controller 118 monitors through the voltmeter 124 the target voltage during and throughout the magnetron scan. The controller 118 compares the monitored voltage to a preset desired voltage and directs the vertical actuator motor 62 to vertically move the magnetron 72 in the direction to bring the target voltage back to the desired voltage. The desired voltage corresponds to the desired spacing between the magnetron 72 and the sputtering surface so as to dynamically compensate for target erosion. It is understood that closed-loop feedback control requires careful consideration of control theory to avoid over compensation and oscillations. Closed-loop control often involves complex PID control involving proportion, integration, and differentiation of the monitored signals. Further enhancements are possible because of the slow change in erosion during the repetitive scanning.

Although the invention has been developed for use with a three-axis scan mechanism allowing nearly arbitrary scan paths, it may advantageously employed to other magnetron scan mechanisms, such as the dual position magnetron described by Hong et al. in U.S. Pat. No. 7,018,515.

The invention thus provides better control of the plasma sputtering and easy determination of end of life for the target with little additional hardware or testing.

The invention claimed is:

1. A method of scanning a magnetron in back of a planar target in a plasma sputter chamber, comprising the steps of:
    applying power to the planar target to excite a plasma within the chamber and sputtering from the planar target;
    during the sputtering, scanning the magnetron about a central axis of the chamber along a selected path adjacent the planar target and having radial and azimuthal components with respect to the central axis; and
    calculating as a function of at least different radii from the central axis an erosion profile of the planar target which is produced by the sputtering, wherein the erosion profile is calculated from operational parameters applied to the plasma sputter chamber by a computer-based controller during the scanning to control the power being applied and the selected path being scanned including radial positions of the selected path, wherein the calculating includes updating a plurality of values of accumulated energy, wherein the values are associated with at least respective radii of the magnetron from the central axis during the scanning.

2. The method of claim 1, further comprising removing the planar target from service when the calculated erosion profile indicates a predetermined limit of erosion of the planar target.

3. The method of claim 1, wherein the operational parameters do not include azimuthal positions of the selected path.

4. The method of claim 1, further comprising adjusting a vertical position of the magnetron along the central axis based upon the calculated erosion profile.

5. The method of claim 1, wherein the updating includes incrementing the respective values by a product of target power and a time the magnetron was disposed at different radii to which the respective values correspond.

6. A method of scanning a magnetron in back of a planar target in a plasma sputter chamber, comprising the steps of:
    applying power to the planar target to excite a plasma within the chamber and sputtering material from the planar target onto a substrate in the chamber;
    during the sputtering, scanning the magnetron about a central axis of the chamber along a selected path adjacent the planar target and having radial and azimuthal components with respect to the central axis;
    calculating an erosion profile of the planar target as a function of at least different radii from a center of the planar target which is produced by the sputtering from operational parameters applied to the plasma sputter chamber from a computer-based controller during the scanning including radial positions of the selected path, wherein the calculating includes updating a plurality of values of accumulated energy, wherein the values are associated with at least respective radii of the magnetron from the central axis during the scanning; and vertically moving the magnetron parallel to the central axis based upon the calculated profile.

7. The method of claim 6, wherein the magnetron is vertically moved only between scanning steps for different substrates.

8. The method of claim 6, wherein the magnetron is vertically moved during the applying step.

9. The method of claim 6, further comprising removing the planar target from service when the calculated erosion profile indicates a limit of erosion of the planar target has been exceeded.

10. A method of scanning a magnetron in back of a planar target in a plasma sputter chamber, comprising the steps of:
    applying power to the planar target to excite a plasma within the chamber and sputtering material from the planar target onto a substrate in the chamber;
    during the sputtering, scanning the magnetron about a central axis of the chamber along a selected path adjacent the planar target and having radial and azimuthal components with respect to the central axis;
    calculating an erosion profile as a function of different radii of the planar target from the central axis produced by the sputtering from operational parameters applied to the plasma sputter chamber by a computer-based controller during the scanning including radial positions of the selected path, wherein the calculating includes updating a plurality of values of accumulated energy, wherein the values are associated with at least respective radii of the magnetron from the central axis during the scanning; and
    vertically moving the magnetron parallel to the central axis based upon the calculated profile.

11. The method of claim 10, wherein the updating includes incrementing the respective values by a product of target power and a time the magnetron was disposed at respective ones of the radii to which the respective values correspond.

12. A method of scanning a magnetron, comprising the steps of:
    scanning a magnetron in back of a planar target in a plasma sputter chamber along a path adjacent the planar target and having radial and azimuthal components about a central axis of the chamber;
    during the scanning, applying power to the target to excite a plasma within the chamber and sputtering material from the planar target to thereby deposit the material onto a substrate;
    calculating an erosion profile of the planar target at at least different radii from the central axis and produced by the sputtering from operational parameters applied to the plasma sputter chamber by a computer-based controller during the scanning including radial positions of the selected path, wherein the parameters control the power being applied to the planar target and the path being scanned, wherein the calculating includes updating a plurality of values of accumulated energy, wherein the values are associated with at least respective radii of the magnetron from the central axis during the scanning; and
    vertically moving the magnetron parallel to central axis in accordance with the determined erosion profile.

13. The method of claim 12, wherein the operational parameters include power applied to the planar target during different time periods of the applying.

14. The method of claim 12, wherein the moving is performed concurrently with the scanning and applying steps.

15. The method of claim 12, wherein the moving is performed only between steps of depositing the material onto different substrates.

* * * * *